United States Patent
Hsu et al.

(10) Patent No.: US 10,062,620 B1
(45) Date of Patent: Aug. 28, 2018

(54) HOUSING ASSEMBLY AND MEMORY DEVICE

(71) Applicant: NANYA TECHNOLOGY CORPORATION, New Taipei (TW)

(72) Inventors: Jui-Chung Hsu, Pingtung County (TW); Wu-Der Yang, Taoyuan (TW); Chia-Chi Hsu, Taoyuan (TW)

(73) Assignee: Nanya Technology Corporation, New Taipei (TW)

( * ) Notice: Subject to any disclaimer, the term of this patent is extended or adjusted under 35 U.S.C. 154(b) by 0 days.

(21) Appl. No.: 15/487,193

(22) Filed: Apr. 13, 2017

(51) Int. Cl.
*H01L 23/045* (2006.01)
*H01L 23/552* (2006.01)

(52) U.S. Cl.
CPC .......... *H01L 23/045* (2013.01); *H01L 23/552* (2013.01)

(58) Field of Classification Search
CPC ............... H01L 23/045; H01L 23/552–23/556
See application file for complete search history.

(56) References Cited

U.S. PATENT DOCUMENTS

| 7,863,089 | B2 | 1/2011 | Coteus et al. | |
|---|---|---|---|---|
| 2012/0300412 | A1* | 11/2012 | Song | H01L 23/552 361/728 |
| 2014/0192583 | A1* | 7/2014 | Rajan | G11C 7/10 365/63 |
| 2014/0252569 | A1* | 9/2014 | Ikuma | H01L 23/66 257/659 |

OTHER PUBLICATIONS

Blog related to semiconductor manufacturing technology. Blog [on-line] 2009 [retrieved on Apr. 13, 2017]. Retrieved from the Internet: <http://ictesting-tom.blogspot.tw/2009_02_01_archive.html>.

* cited by examiner

*Primary Examiner* — Walter H Swanson
(74) *Attorney, Agent, or Firm* — Muncy, Geissler, Olds & Lowe, P.C.

(57) ABSTRACT

A die device includes a die including an active layer; and an interconnect feature configured for electrical connection of the active layer, wherein the interconnect feature is in contact with a substrate in the die; and a bump, independent of the die, configured for electrical connection of the active layer.

20 Claims, 7 Drawing Sheets

| DQ | -0.3 | -0.275 | -0.25 | -0.225 | -0.2 | -0.175 | -0.15 | -0.125 | -0.1 | -0.075 | -0.05 | -0.025 | 0 | 0.025 | 0.05 | 0.075 | 0.1 | 0.125 | 0.15 | 0.175 | 0.2 | 0.225 | 0.25 | 0.275 | 0.3 | 0.325 | 0.35 | 0.375 | 0.4 |
|---|---|---|---|---|---|---|---|---|---|---|---|---|---|---|---|---|---|---|---|---|---|---|---|---|---|---|---|---|---|
| 0 | 1 | 1 | 1 | 1 | 1 | 1 | 1 | 1 | 1 | 1 | 1 | 1 | 0 | 0 | 0 | 0 | 0 | 0 | 0 | 0 | 0 | 0 | 0 | 0 | 1 | 1 | 1 | 1 | 1 |
| 1 | 1 | 1 | 1 | 1 | 1 | 1 | 1 | 1 | 1 | 1 | 1 | 0 | 0 | 0 | 0 | 0 | 0 | 0 | 0 | 0 | 0 | 0 | 0 | 0 | 1 | 1 | 1 | 1 | 1 |
| 2 | 1 | 1 | 1 | 1 | 1 | 1 | 1 | 1 | 1 | 1 | 0 | 0 | 0 | 0 | 0 | 0 | 0 | 0 | 0 | 0 | 0 | 0 | 0 | 1 | 1 | 1 | 1 | 1 | 1 |
| 3 | 1 | 1 | 1 | 1 | 1 | 1 | 1 | 1 | 1 | 0 | 0 | 0 | 0 | 0 | 0 | 0 | 0 | 0 | 0 | 0 | 0 | 0 | 1 | 1 | 1 | 1 | 1 | 1 | 1 |
| 4 | 1 | 1 | 1 | 1 | 1 | 1 | 1 | 0 | 1 | 0 | 0 | 0 | 0 | 0 | 0 | 0 | 0 | 0 | 0 | 0 | 0 | 0 | 1 | 1 | 1 | 1 | 1 | 1 | 1 |
| 5 | 1 | 1 | 1 | 1 | 1 | 1 | 1 | 1 | 1 | 1 | 0 | 0 | 0 | 0 | 0 | 0 | 0 | 0 | 0 | 0 | 0 | 0 | 0 | 1 | 1 | 1 | 1 | 1 | 1 |
| 6 | 1 | 1 | 1 | 1 | 1 | 1 | 1 | 1 | 0 | 0 | 0 | 0 | 0 | 0 | 0 | 0 | 0 | 0 | 0 | 0 | 0 | 0 | 0 | 1 | 1 | 1 | 1 | 1 | 1 |
| 7 | 1 | 1 | 1 | 1 | 1 | 1 | 1 | 1 | 0 | 0 | 0 | 0 | 0 | 0 | 0 | 0 | 0 | 0 | 0 | 0 | 0 | 0 | 1 | 1 | 1 | 1 | 1 | 1 | 1 |

FIG. 4

| DQ | -0.3 | -0.275 | -0.25 | -0.225 | -0.2 | -0.175 | -0.15 | -0.125 | -0.1 | -0.075 | -0.05 | -0.025 | 0 | 0.025 | 0.05 | 0.075 | 0.1 | 0.125 | 0.15 | 0.175 | 0.2 | 0.225 | 0.25 | 0.275 | 0.3 | 0.325 | 0.35 | 0.375 | 0.4 |
|---|---|---|---|---|---|---|---|---|---|---|---|---|---|---|---|---|---|---|---|---|---|---|---|---|---|---|---|---|---|
| 0 | 1 | 1 | 1 | 1 | 1 | 1 | 1 | 1 | 0 | 0 | 0 | 0 | 0 | 0 | 0 | 0 | 0 | 0 | 0 | 0 | 0 | 0 | 1 | 1 | 1 | 1 | 1 | 1 | 1 |
| 1 | 1 | 1 | 1 | 1 | 1 | 1 | 1 | 1 | 0 | 0 | 0 | 0 | 0 | 0 | 0 | 0 | 0 | 0 | 0 | 0 | 0 | 0 | 0 | 1 | 1 | 1 | 1 | 1 | 1 |
| 2 | 1 | 1 | 1 | 1 | 1 | 1 | 1 | 0 | 0 | 0 | 0 | 0 | 0 | 0 | 0 | 0 | 0 | 0 | 0 | 0 | 0 | 0 | 1 | 1 | 1 | 1 | 1 | 1 | 1 |
| 3 | 1 | 1 | 1 | 1 | 1 | 1 | 0 | 0 | 0 | 0 | 0 | 0 | 0 | 0 | 0 | 0 | 0 | 0 | 0 | 0 | 0 | 1 | 1 | 1 | 1 | 1 | 1 | 1 | 1 |
| 4 | 1 | 1 | 1 | 1 | 1 | 1 | 1 | 0 | 0 | 0 | 0 | 0 | 0 | 0 | 0 | 0 | 0 | 0 | 0 | 0 | 0 | 0 | 1 | 1 | 1 | 1 | 1 | 1 | 1 |
| 5 | 1 | 1 | 1 | 1 | 1 | 1 | 1 | 1 | 0 | 0 | 0 | 0 | 0 | 0 | 0 | 0 | 0 | 0 | 0 | 0 | 0 | 0 | 1 | 1 | 1 | 1 | 1 | 1 | 1 |
| 6 | 1 | 1 | 1 | 1 | 1 | 1 | 1 | 0 | 0 | 0 | 0 | 0 | 0 | 0 | 0 | 0 | 0 | 0 | 0 | 0 | 0 | 0 | 0 | 1 | 1 | 1 | 1 | 1 | 1 |
| 7 | 1 | 1 | 1 | 1 | 1 | 1 | 1 | 0 | 0 | 0 | 0 | 0 | 0 | 0 | 0 | 0 | 0 | 0 | 0 | 0 | 0 | 0 | 1 | 1 | 1 | 1 | 1 | 1 | 1 |

FIG. 6

HOUSING ASSEMBLY AND MEMORY DEVICE

TECHNICAL FIELD

The present disclosure relates to a housing assembly, and more particularly, to a housing assembly including housing of conductive material.

DISCUSSION OF THE BACKGROUND

Certain semiconductor devices, such as SRAMs, DRAMS, or DDR-DRAMs (DRAMs with double data rate), may be inserted in an appropriate device module, with the electrical connections or pins of the semiconductor device coming in contact with the corresponding module pads. After the incorporation of the semiconductor device into the device module, in particular after the soldering of the pins, which is are in a housing of the semiconductor device, to the module pads, a test may be performed by an appropriate testing device to determine whether the pins of the semiconductor device effectively contact the respective module pads.

This Discussion of the Background section is provided for background information only. The statements in this Discussion of the Background are not an admission that the subject matter disclosed in this section constitutes prior art to the present disclosure, and no part of this section may be used as an admission that any part of this application, including this Discussion of the Background section, constitutes prior art to the present disclosure.

SUMMARY

One aspect of the present disclosure provides a housing assembly, including a housing that includes: a conductive bulk having a first sidewall defining a first hole in the conductive bulk, and having a second sidewall defining a second hole in the conductive bulk, wherein a voltage level of the conductive bulk is kept at a reference ground; and an insulating layer covering the first sidewall, wherein the second sidewall is free from being covered by the insulating layer.

In some embodiments, the housing assembly further includes a supporting feature including: a conductive portion, extending into the second hole of the conductive bulk, configured to keep the voltage level of the conductive bulk at the reference ground.

In some embodiments, the conductive portion is in contact with the conductive bulk.

In some embodiments, the supporting feature further includes a support portion external to the housing.

In some embodiments, the insulating layer fully covers surfaces of the conductive bulk except for a surface of the second sidewall of the conductive bulk.

In some embodiments, material of the conductive bulk includes aluminum.

Another aspect of the present disclosure provides a memory device, including: a substrate; a housing assembly including: a housing that includes: a conductive bulk defining a plurality of first holes in the conductive bulk; and an insulating layer on the conductive bulk; a first pin in a first pin hole of the first holes; and a second pin in a second pin hole of the first holes, wherein the first pin and the second pin are separated from each other by a portion of the conductive bulk, wherein each of the first pin and the second pin is electrically insulated from the conductive bulk by the insulating layer, and each of the first pin and the second pin is configured to transmit data signal.

In some embodiments, the conductive bulk includes a plurality of first sidewalls defining the first holes, wherein the insulating layer fully covers each of the first sidewalls.

In some embodiments, the conductive bulk further defines a second hole in the conductive bulk, and the housing assembly further includes a supporting feature including a conductive portion, extending into the second hole and being in contact with the conductive bulk, wherein the conductive portion is configured to keep a voltage level of the conductive bulk at a reference ground.

In some embodiments, the conductive bulk further has a second sidewall defining the second hole, wherein the second sidewall is free from being covered by the insulating layer.

In some embodiments, the insulating layer fully covers surfaces of the conductive bulk except for a surface of the second sidewall of the conductive bulk.

In some embodiments, the conductive portion extends from the second hole to the substrate.

In some embodiments, the supporting feature further includes a supporting portion external to the housing.

In some embodiments, material of the conductive bulk includes aluminum.

Another aspect of the present disclosure provides a memory device, including: a housing assembly, including: a housing, including: a bulk assembly, including: a conductive bulk defining a first hole in the conductive bulk, wherein a voltage level of the conductive bulk is kept at a reference ground; and an insulating bulk, integrated with the conductive bulk, defining a second hole in the insulating bulk; an insulating layer on the conductive bulk; a first pin, wherein the first pin is in the first hole and insulated from the conductive bulk by the insulation layer, wherein the first pin is configured to transmit data signal; and a second pin, wherein the second pin is in the second hole and in contact with the insulation bulk, wherein the second pin is configured to transmit data signal, wherein the number of pins, functioning to transmit data signal, surrounding the first pin is greater than the number of pins surrounding the second pin.

In some embodiments, the conductive bulk includes a first sidewall defining the first hole, wherein the insulating layer fully covers the first sidewall.

In some embodiments, the conductive bulk further defines a second hole in the conductive bulk, and the housing assembly further includes a supporting feature including a conductive portion, wherein the conductive portion extends into the second hole of the conductive bulk and is in contact with the conductive bulk, wherein the conductive portion is configured to keep a voltage level of the conductive bulk at a reference ground.

In some embodiments, the conductive bulk further has a second sidewall defining the second hole, wherein the second sidewall is free from being covered by the insulating layer.

In some embodiments, the insulating layer fully covers surfaces of the conductive bulk except for a surface of the second sidewall of the conductive bulk.

In some embodiments, the conductive portion extends from the second hole to the substrate.

In the present disclosure, in a housing assembly of the present disclosure, data pins are separated from each other by a conductive bulk having a voltage kept at reference ground and therefore cross talk between the data pins can be greatly alleviated or even eliminated. In this way, skew of signals transmitted by the data pins can be significantly reduced, thereby significantly reducing skew difference. Moreover, since the skew is reduced, the frequency of setup-time check pass is increased, and performance of the memory device of the present disclosure is accordingly improved.

Moreover, in accordance with the design approach of the present disclosure, in a design stage of a memory device, if a design specification indicates that the number of pins, functioning to transmit data signal, surrounding a data pin is relatively great, a conductive bulk can be selected to receive the data pin. In this way, a skew of a signal transmitted by the data pin can be alleviated or eliminated. Additionally, when the number of pins, functioning to transmit data signal, surrounding another data pin is relatively less, an insulating bulk can be selected to receive the other data pin. Versatility of a memory device is thereby enhanced.

In some comparative embodiments, since an insulation bulk is selected to receive data pins, cross talk between the data pins is significantly serious. In particular, when all of the data pins transmit the same data, for example, a data stream of 10101010, at the same time, cross talk is relatively significant. Such significant cross talk will incur a serious level of skew and therefore a serious of a skew difference. As a result, an operation speed of the memory device of the comparative embodiments is relatively slow, and may not be able to be enhanced.

The foregoing has outlined rather broadly the features and technical advantages of the present disclosure in order that the detailed description of the disclosure that follows may be better understood. Additional features and advantages of the disclosure are described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

FIG. 4 is a diagram illustrating a simulation result of the memory device shown in FIG. 1, in accordance with a comparative embodiment of the present disclosure.

FIG. 6 is a diagram illustrating a simulation result of the memory device shown in FIG. 5, in accordance with an embodiment of the present disclosure.

DETAILED DESCRIPTION

Figure 1:
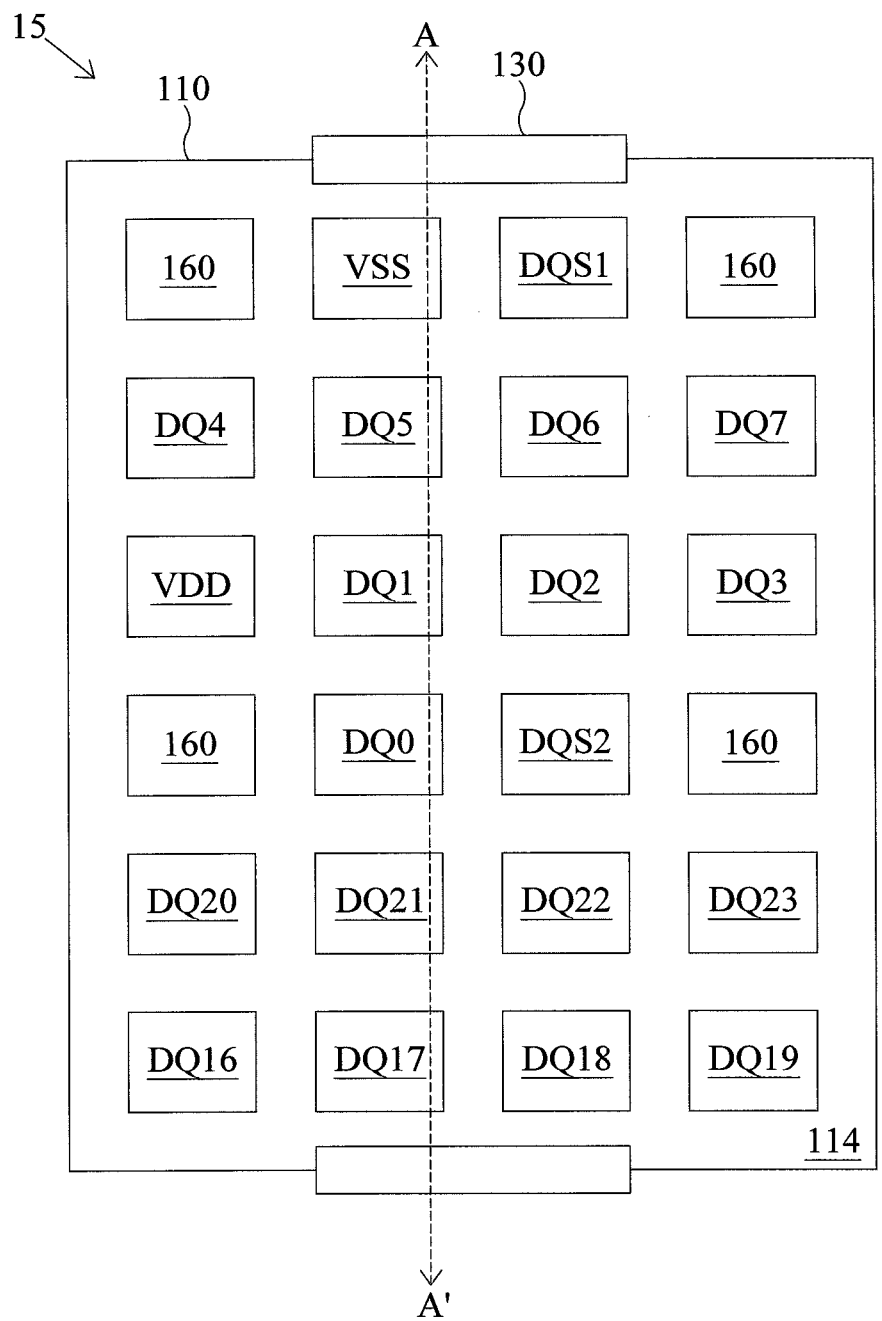
FIG. 1 is a top view diagram of a memory device, in accordance with a comparative embodiment of the present disclosure.

Embodiments, or examples, of the disclosure illustrated in the drawings are now described using specific language. It shall be understood that no limitation of the scope of the disclosure is thereby intended. Any alteration or modification to the described embodiments, and any further applications of principles described in this document, are to be considered as normally occurring to one of ordinary skill in the art to which the disclosure relates. Reference numerals may be repeated throughout the embodiments, but this does not necessarily require that feature(s) of one embodiment apply to another embodiment, even if they share the same reference numeral.

It shall be understood that when an element is referred to as being "connected to" or "coupled with" another element, it may be directly connected to or coupled to the other element, or intervening elements may be present.

It shall be understood that, although the terms first, second, third, etc. may be used herein to describe various elements, components, regions, layers or sections, these elements, components, regions, layers or sections should not be limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It shall be further understood that the terms "comprises" and "comprising," when used in this specification, specify the presence of stated features, integers, steps, operations, elements, or components, but do not preclude the presence or addition of one or more other features, integers, steps, operations, elements, components, or groups thereof.

FIG. 1 is a top view diagram of a memory device 10, in accordance with a comparative embodiment of the present disclosure. Referring to FIG. 1, the memory device 10 includes a housing assembly 15. The housing assembly 15 includes a housing 110 and a supporting feature 130. The supporting feature 130 functions to support the housing 110.

The housing 110 includes an insulating bulk 114. In an embodiment, material of the insulating bulk 114 includes engineering plastic. The insulating bulk 114 functions to receive a plurality of pins including data pins DQ0 to DQ7 and DQ16 to DQ23, clock pins DQS1 and DQS2, a power pin VDD, a ground pin VSS and pins 160. For convenience and clarity of illustration, only a portion of the pins is shown in FIG. 1 and the insulating bulk 144 may receive other pins.

The data pin DQ0 functions to transmit data signal. The remaining data pins DQ1 to DQ7 and DQ16 to DQ23 have the same function as the data pin DQ0. The clock pin DQS1 functions to transmit a clock signal applied to a gate of a die device (shown in FIG. 2). The gate, such as a flip-flop, functions to, in response to a rising edge of the clock signal, capture a data signal. The clock pin DQS2 has the same function as the clock pin DQS1. The power pin VDD functions to provide a global supply voltage, under which the die device operates. The ground pin VSS functions to provide a global reference ground.

Figure 2:
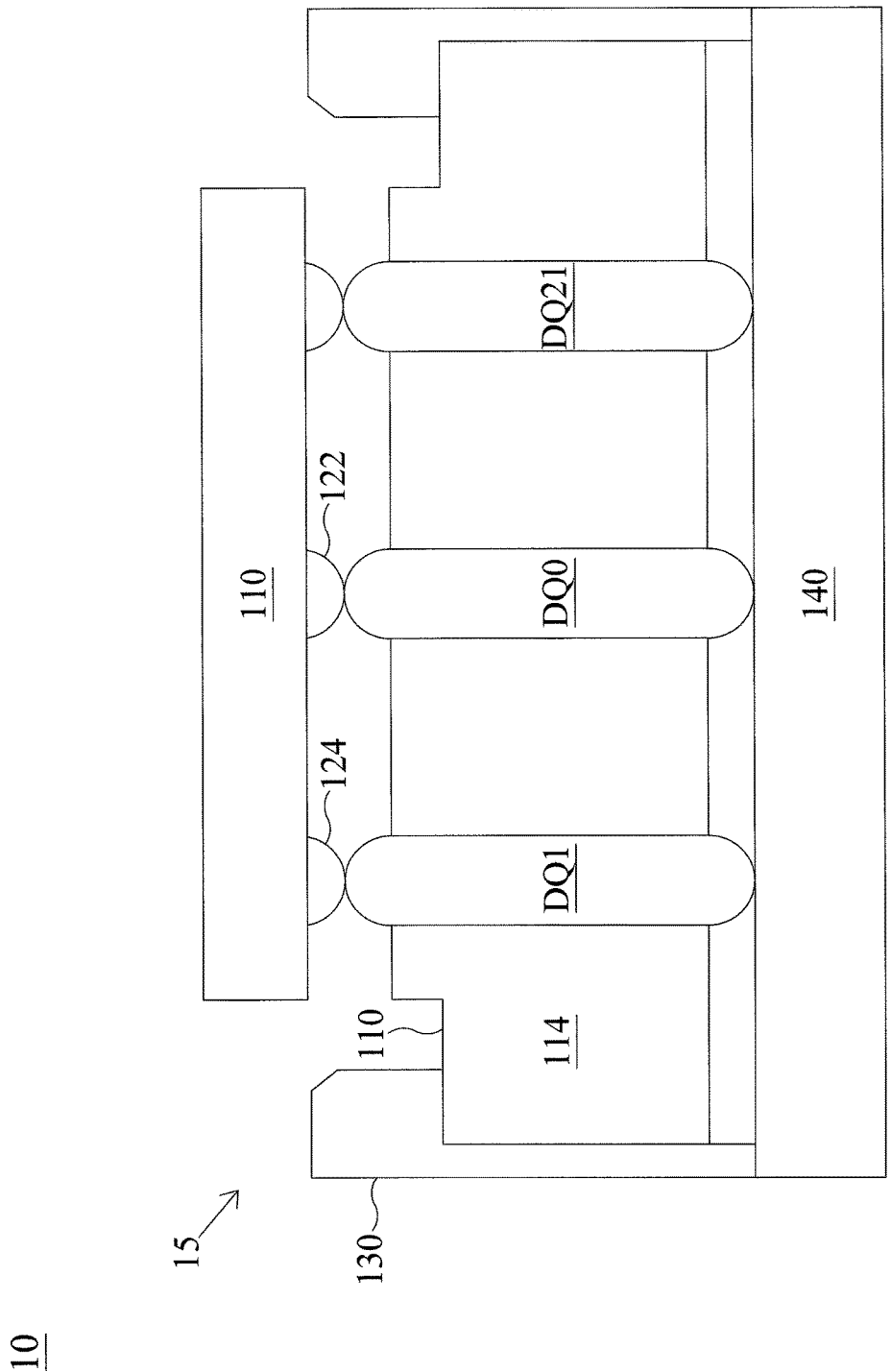
FIG. 2 is a cross-sectional view of the memory device shown in FIG. 1 taken along a line A-A', in accordance with a comparative embodiment of the present disclosure.

FIG. 2 is a cross-sectional view of the memory device 10 shown in FIG. 1 taken along a line A-A', in accordance with a comparative embodiment of the present disclosure. Referring to FIG. 2, for simplifying illustration, the data pins DQ5 and DQ17 and the ground pin VSS are not depicted. The memory device 10 further includes a die device 110 including conductive pads 122 and 124, and a substrate 140 in addition to the housing assembly 15.

Cross talk may occur between pins, for example, between the data pins DQ0 and DQ1, between the data pins DQ0 and DQ21, or, referring back to FIG. 1, between the data pins DQ1 and DQ2. The cross talk incurs a skew of a data signal transmitted by a data pin. For example, cross talk between the data pins DQ0 and DQ1 incurs a first skew of a data signal transmitted by the data pin DQ0 while incurring a second skew of a data signal transmitted by the data pin DQ1. The first skew may be different from the second skew. Therefore, data signals received by the conductive pads 122 and 124 may be different in a time domain due to the different first and second skews although the data signals are provided by the same signal source.

Moreover, when the cross talk becomes more serious, both the first skew and the second skew accordingly become serious. Moreover, the first skew may be different the second skew. Therefore, a skew difference between the first skew and the second skew may also increase, which would adversely affect performance of a memory device. Additionally, referring back to FIG. 1, when all of the data pins DQ0 to DQ7 and DQ16 to 23 transmit the same data, for example, a data stream of 10101010, at the same time, cross talk is relatively significant. Such relatively significant cross talk will incur the relatively serious first and second skews and the relatively serious skew difference. As a result, an operation speed of the memory device 10 is relatively low, and may not be able to be enhanced.

Figure 3:
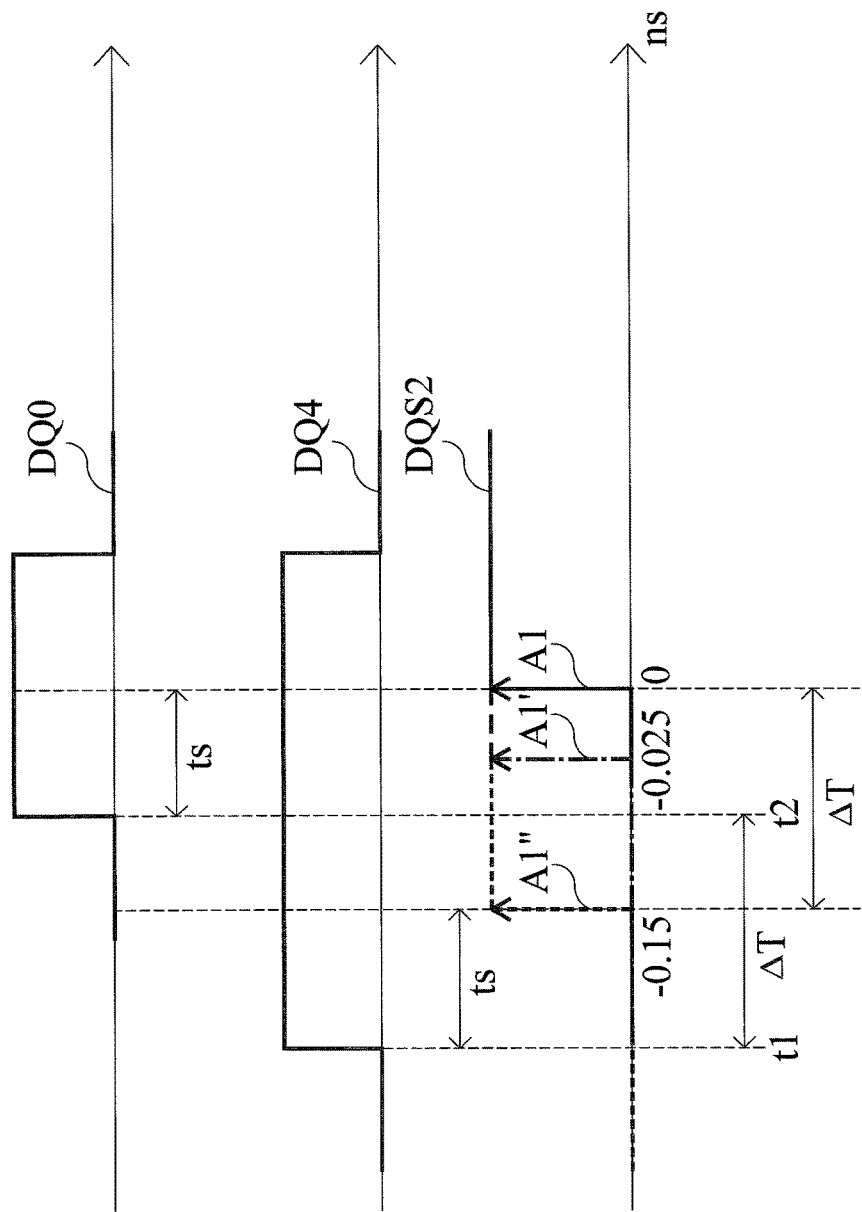
FIG. 3 is a signal wave diagram illustrating a setup time of a data signal, in accordance with a comparative embodiment of the present disclosure.

FIG. 3 is a signal wave diagram illustrating a setup time of a data signal; in accordance with a comparative embodiment of the present disclosure. Referring to FIG. 3, for convenience of discussion, a data signal transmitted by the data pin DQ0 is labeled "DQ0." A data signal transmitted by the data pin DQ4 is labeled "DQ4." A clock signal transmitted by, for example, the clock pin DQS2 is labeled "DQS2." Based on a result of a setup-time check, and by shifting the clock signal DQS2, a skew difference between a first skew of the data signal DQ0 and a second skew of the data signal DQ4 can be determined. Details of such process are provided in the following description.

A setup time ts is a predetermined value, and is used to determine whether a setup-time check has passed. An approach to the setup-time check is as follows. Taking the data signal DQ0 for instance, by means of simulation, a rising edge A1 of the clock signal DQS2 is set up at a timing of 0 nano seconds (ns). After the simulation, the simulation result indicates that the setup-time has passed, which implies that a timing difference between a receiving time t2 of the data signal DQ0 and the timing of 0 ns is greater than or equal to the setup time. Next, the clock signal DQS2 is shifted earlier, such that the rising edge A1 is shifted to a rising edge A1', which appears at a timing of about −0.025 ns. After the simulation, the simulation result indicates that the setup-time has failed, which implies that a timing difference between the receiving time t2 and the timing of −0.025 ns is less than the setup time ts. This indicates that a rising edge for passing the setup-time check is substantially the rising edge A1. For the data signal DQ4, by using the same approach as that used for the data signal DQ0, the rising edge for passing the setup-time check is a rising edge A1".

For both the data signals DQ0 and DQ4, the setup time ts is the same. Therefore, since the rising edge A1 for the data signal DQ0 is later than the rising edge A1" for the data signal DQ4, it is determined that the first skew of the data signal DQ0 is more serious than the second skew of the data signal DQ4. Moreover, also due to the same setup time ts, a skew difference between the receiving time t2 and the receiving time t1 is substantially the same as a timing difference between a timing at which the rising edge A1 appears and a timing at which the rising edge A1" appears. Through these steps, the skew difference can be indirectly obtained. In the present comparative embodiment, the skew difference between the data signals DQ0 and DQ4 is about 0.15 ns and is relatively significant.

FIG. 4 is a diagram illustrating a simulation result of the memory device 10 shown in FIG. 1, in accordance with a comparative embodiment of the present disclosure. Referring to FIG. 4, numbers in the leftmost column of the table represent data pins DQ0 to DQ7. Timings in the uppermost row represent a timing at which a rising edge of, for example, the clock signal DQS2 appears. Values 1 and 0 in the table represent failure and pass, respectively, of a setup-time check. The simulation result of the setup-time check is obtained according to the approaches illustrated in FIG. 3. The skew difference between the data signals DQ0 and DQ4 is about 0.15 ns, which is relatively significant.

Moreover, referring back to FIG. 1, the data pin DQ0 is surrounded by the data pins DQ21 and DQ1. The data pin DQ4 is surrounded by only a single data pin DQ5. The number of pins, functioning to transmit data, surrounding the data pin DQ0 is greater than the number of pins transmitting data surrounding the data pin DQ4. That is, when the number of pins, functioning to transmit a data signal, surrounding a data pin increases, a skew of a data signal transmitted by the data pin becomes more significant.

Figure 5:
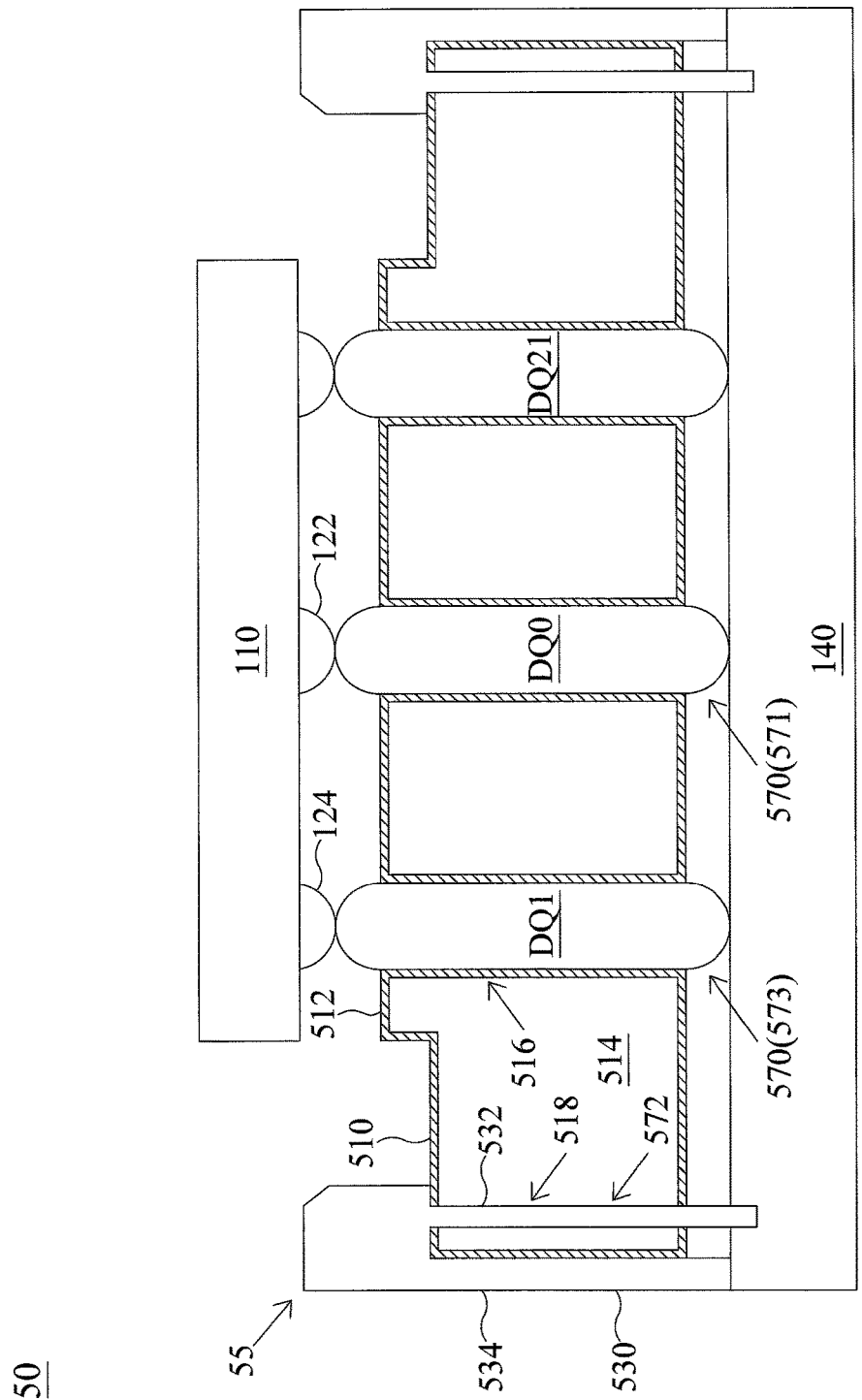
FIG. 5 is a schematic diagram of a memory device, in accordance with an embodiment of the present disclosure.

FIG. 5 is a schematic diagram of a memory device 50, in accordance with an embodiment of the present disclosure. Referring to FIG. 5, the memory device 50 is similar to the memory device 10 described and illustrated with reference to FIG. 2, except that the memory device 50 includes a housing assembly 55 including a supporting feature 530 and a housing 510.

The housing 510 functions to receive a plurality of pins including data pins DQ0, DQ1 and DQ21 as illustrated in FIG. 2. The data pins DQ0, DQ1 and DQ21 function to transmit data signal from the substrate 140. For convenience of discussion, the data pin DQ0 is called a first pin, and the data pin DQ1 is called a second pin. The housing 510 includes a conductive bulk 514 and an insulating layer 512 on the conductive bulk 514. Accordingly, the first pin DQ0 and the second pin DQ1 are separated from each other by a portion of the conductive bulk 514. In an embodiment, material of the conductive bulk 514 includes aluminum.

The conductive bulk 514 has a plurality of first sidewalls 516 and a second sidewall 518. Each of the first sidewalls 516 defines a first hole 570 in the conductive bulk 514. For convenience of discussion, one of the first holes 570 is called a first pin hole 571 and another is called a second pin hole 573. Moreover, the first sidewall 516 is fully covered by the insulating layer 512. Therefore, even though the first pin DQ0 and the second pin DQ1 are in a first pin hole 571 and second pin hole 573 respectively, both the first pin DQ0 and the second pin DQ1 are electrically insulated from the conductive bulk 514 by the insulating layer 512.

The second sidewall 518 defines a second hole 572 in the conductive bulk 514. Moreover, the second sidewall 518 is free from being (i.e., is not) covered by the insulating layer 512. That is, the insulating layer 512 fully covers surfaces of the conductive bulk 514 except for a surface of the second sidewall 518 of the conductive bulk 514.

The supporting feature 530 includes a conductive portion 532, and a support portion 534 external to the housing 510. The conductive portion 532 functions to keep a voltage level of the conductive bulk 514 at a reference ground. Moreover, the conductive portion 532 extends into the second hole 572 of the conductive bulk 514, and is in contact with the conductive bulk 514. Since both the conductive portion 532 and the conductive bulk 514 are conductive, a voltage level of both the conductive portion 532 and the conductive bulk 514 is substantially the same. Additionally, the conductive portion 532 extends from the second hole 572 to the substrate 140. Typically, a voltage level of the substrate 140 is the reference ground. As a result, a voltage level of the conductive bulk 514 is kept at a reference ground by means of the conductive portion 532.

With the housing assembly 55, data pins, such as the data pins DQ0 and DQ1, are separated by a conductive bulk with reference ground and therefore cross talk between the data pins can be greatly alleviated or eliminated. In this way, a skew of a signal and a skew difference is significantly reduced, as demonstrated by FIG. 6.

FIG. 6 is a diagram illustrating a simulation result of the memory device 50 shown in FIG. 5, in accordance with an embodiment of the present disclosure. Referring to FIG. 6, a rising edge for the data signal DQ0 appears at a timing of −0.1 ns, which is earlier than the timing of 0 ns discussed in FIG. 2. That is, the first skew of the data signal DQ0 is alleviated. Moreover, a rising edge for the data signal DQ4 appears at a timing of −0.15 ns, which is earlier than the timing of −0.125 ns. That is, the second skew of the data signal DQ4 is alleviated. As a result, the skew difference is 0.05 ns, which is less than the skew difference for the memory device 10 shown in FIG. 2. As a result, performance of the memory device 50 is better than that of the memory device 10.

Additionally, when testing a plurality of memory devices 50 for normal functioning under a specific operation speed (speed=1600), an average of 99.78 percent of the memory devices 50 will operate normally. In contrast, when testing the memory devices 10 for normal functioning under the same operation speed (speed=1600), an average of only 85.71 percent of the memory devices 10 will operate normally.

Moreover, when testing the memory devices 50 for normal functioning under another specific operation speed (speed=1866), an average of 85.94 percent of the memory devices 50 will operate normally. In contrast, when testing the memory devices 10 for normal functioning under the same operation speed (speed=1866), none of the memory devices 10 operates normally.

Figure 7:
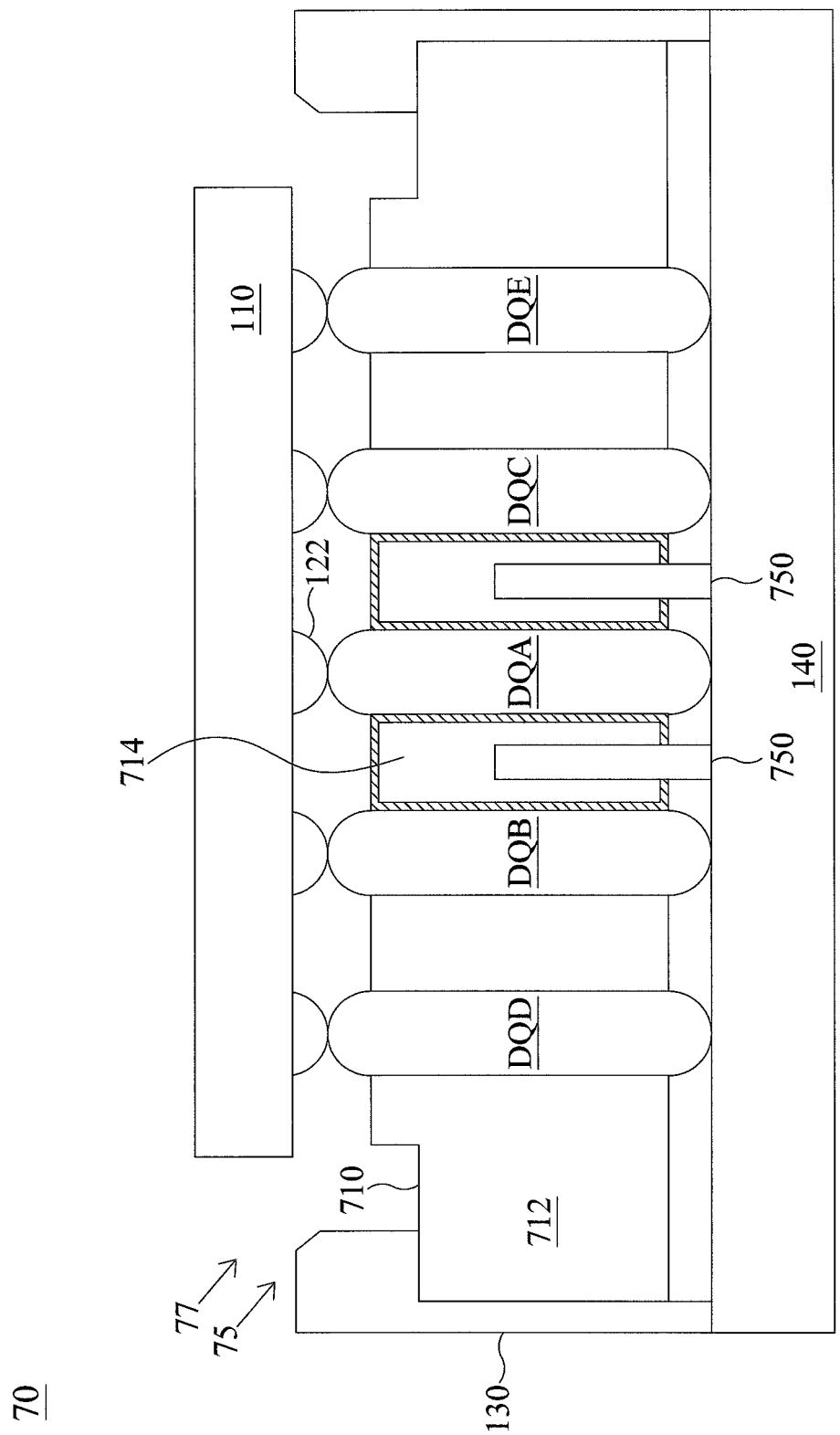
FIG. 7 is a schematic diagram of another memory device, in accordance with an embodiment of the present disclosure.

FIG. 7 is a schematic diagram of another memory device 70, in accordance with an embodiment of the present disclosure. Referring to FIG. 7, the memory device 70 is similar to the memory device 50 described and illustrated with reference to FIG. 5 except that the memory device 70 includes a housing assembly 75.

The housing assembly 75 includes a first supporting feature 130, a second supporting feature including conductive portions 750, a bulk assembly 77 including an insulating bulk 712 and a conductive bulk 714, and data pins DQA to DQE.

Interaction and arrangement among the data pin DQA, the conductive bulk 714 and the conductive portions 750 are the same as those among the data pin DQ0, the conductive bulk 514 and the conductive portion 532. Moreover, the conductive portion 750 may function to support the conductive bulk 712 over the substrate 140. Therefore, to avoid repetition, the detailed description is omitted herein. Moreover, interaction and arrangement among the data pin DQD, the insulating bulk 712 and the first supporting feature 130 are the same as those among the data pin DQ0, the insulating bulk 114 and the supporting feature 130 described and illustrated with reference to FIG. 2. Therefore, the detailed description is omitted herein.

The number of pins functioning to transmit data signal surrounding the data pin DQA is greater than the number of pins surrounding the data pin DQD. That is, in a design stage of a memory device, if a design specification indicates that the number of pins functioning to transmit data signal surrounding the data pin DQA is relatively great, a conductive bulk, such as the conductive bulk 714, can be selected to receive the data pin DQA. In this way, a skew of a signal transmitted by the data pin DQA can be alleviated or eliminated, as discussed earlier. Additionally, when the number of pins functioning to transmit data signal surrounding a data pin is less, an insulating bulk can be selected to receive the data pin. The versatility of a memory device is enhanced.

In further detail, with the housing assembly of the present disclosure, data pins are separated from each other by a conductive bulk with a voltage held at reference ground and therefore cross talk between the data pins can be greatly alleviated or eliminated. In this way, skew difference is significantly reduced. Therefore, performance of the memory device of the present disclosure is improved.

One aspect of the present disclosure provides a housing assembly, including a housing, including: a conductive bulk having a first sidewall defining a first hole in the conductive bulk, and having a second sidewall defining a second hole in the conductive bulk, wherein a voltage level of the conductive bulk is kept at a reference ground; and an insulating layer covering the first sidewall, wherein the second sidewall is not covered by the insulating layer.

Another aspect of the present disclosure provides a memory device, including: a substrate; a housing assembly, including: a housing, including: a conductive bulk defining a plurality of first holes in the conductive bulk; and an insulating layer on the conductive bulk; a first pin in a first pin hole of the first holes; and a second pin in a second pin hole of the first holes, wherein the first pin and the second pin are separated from each other by a portion of the conductive bulk, wherein each of the first pin and the second pin is electrically insulated from the conductive bulk by the insulating layer, and each of the first pin and the second pin is configured to transmit data signal.

Another aspect of the present disclosure provides a memory device, including: a housing assembly, including: a housing, including: a bulk assembly, including: a conductive bulk defining a first hole in the conductive bulk, wherein a voltage level of the conductive bulk is kept at a reference ground; and an insulating bulk, integrated with the conductive bulk, defining a second hole in the insulating bulk; an insulating layer on the conductive bulk; a first pin, in the first hole and being insulated from the conductive bulk by the insulation layer, wherein the first pin is configured to transmit data signal; and a second pin, in the second hole and in contact with the insulation bulk, wherein the second pin is configured to transmit data signal, wherein the number of pins functioning to transmit data signal and surrounding the first pin is greater than the number of pins surrounding the second pin.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A housing assembly, comprising:
   a housing including:
   a conductive bulk having a first sidewall defining a first hole in the conductive bulk, and having a second sidewall defining a second hole in the conductive bulk, wherein a voltage level of the conductive bulk is kept at a reference ground; and
   an insulating layer covering the first sidewall, wherein the second sidewall is free from being covered by the insulating layer.

2. The housing assembly of claim 1, further comprising:
   a supporting feature including:
   a conductive portion, extending into the second hole of the conductive bulk, configured to keep the voltage level of the conductive bulk at the reference ground.

3. The housing assembly of claim 2, wherein the conductive portion is in contact with the conductive bulk.

4. The housing assembly of claim 2, wherein the supporting feature further includes a support portion external to the housing.

5. The housing assembly of claim 1, wherein the insulating layer fully covers surfaces of the conductive bulk except for a surface of the second sidewall of the conductive bulk.

6. The housing assembly of claim 1, wherein material of the conductive bulk includes aluminum.

7. A memory device, comprising:
   a substrate;
   a housing assembly, including:
   a housing, including:
   a conductive bulk defining a plurality of first holes in the conductive bulk; and
   an insulating layer on the conductive bulk;
   a first pin in a first pin hole of the first holes; and
   a second pin in a second pin hole of the first holes,
   wherein the first pin and the second pin are separated from each other by a portion of the conductive bulk,
   wherein each of the first pin and the second pin is electrically insulated from the conductive bulk by the insulating layer, and is configured to transmit a data signal.

8. The memory device of claim 7, wherein the conductive bulk includes a plurality of first sidewalls defining the first holes,
   wherein the insulating layer fully covers each of the first sidewalls.

9. The memory device of claim 7, wherein the conductive bulk further defines a second hole in the conductive bulk, and the housing assembly further includes:
   a supporting feature, including:
   a conductive portion, extending into the second hole and in contact with the conductive bulk, wherein the conductive portion is configured to keep a voltage level of the conductive bulk at a reference ground.

10. The memory device of claim 9, wherein the conductive bulk further has a second sidewall defining the second hole, wherein the second sidewall is free from being covered by the insulating layer.

11. The memory device of claim 10, wherein the insulating layer fully covers surfaces of the conductive bulk except for a surface of the second sidewall of the conductive bulk.

12. The memory device of claim 9, wherein the conductive portion extends from the second hole to the substrate.

13. The memory device of claim 9, wherein the supporting feature further includes a supporting portion external to the housing.

14. The housing assembly of claim 7, wherein material of the conductive bulk includes aluminum.

15. A memory device, comprising:
   a housing assembly, including:
   a housing, including:
   a bulk assembly, including:
   a conductive bulk defining a first hole in the conductive bulk, wherein a voltage level of the conductive bulk is kept at a reference ground; and
   an insulating bulk, integrated with the conductive bulk, defining a second hole in the insulating bulk; and
   an insulating layer on the conductive bulk;
   a first pin, in the first hole and insulated from the conductive bulk by the insulation layer, wherein the first pin is configured to transmit a data signal; and
   a second pin, in the second hole and in contact with the insulation bulk, wherein the second pin is configured to transmit a data signal,
   wherein the number of pins functioning to transmit data signals and surrounding the first pin is greater than the number of pins surrounding the second pin.

16. The memory device of claim 15, wherein the conductive bulk includes a first sidewall defining the first hole,
   wherein the insulating layer fully covers the first sidewall.

17. The memory device of claim 15, wherein the conductive bulk further defines a second hole in the conductive bulk, and the housing assembly further includes:
   a supporting feature, including:
   a conductive portion, extending into the second hole of the conductive bulk and in contact with the conductive bulk, wherein the conductive portion is configured to keep a voltage level of the conductive bulk at a reference ground.

18. The memory device of claim 17, wherein the conductive bulk further has a second sidewall defining the second hole, wherein the second sidewall is free from being covered by the insulating layer.

19. The memory device of claim 18, wherein the insulating layer fully covers surfaces of the conductive bulk except for a surface of the second sidewall of the conductive bulk.

20. The memory device of claim 17, wherein the conductive portion extends from the second hole to the substrate.

\* \* \* \* \*